April 24, 1962 R. B. SOPER 3,031,363
METHOD AND APPARATUS FOR TREATING BODIES
OF SEMICONDUCTOR MATERIAL
Filed Sept. 24, 1959 2 Sheets-Sheet 1

INVENTOR.
RALPH B. SOPER
BY Elmer J. Nealon
ATTORNEY.

INVENTOR.
RALPH B. SOPER
BY Elmer J. Nealon
ATTORNEY.

United States Patent Office 3,031,363

Patented Apr. 24, 1962

3,031,363

METHOD AND APPARATUS FOR TREATING BODIES OF SEMICONDUCTOR MATERIAL

Ralph B. Soper, North Weymouth, Mass., assignor to Sylvania Electric Products Inc., a corporation of Delaware Filed Sept. 24, 1959, Ser. No. 842,140

6 Claims. (Cl. 156—17)

This invention relates to the manufacture of semiconductor electrical translating devices. More particularly, it is concerned with a method and apparatus for producing to close tolerances bodies of semiconductor materials of predetermined dimensions.

In semiconductor devices of well known types the active semiconductor elements therein are generally in the form of small pieces or dice. These dice are produced from blocks or ingots which result from the steps involved in purification, controlled addition of doping impurities, and formation of the initial semiconductor material into a single crystal structure. It is common practice to divide an ingot of appropriately prepared semiconductor material into slabs or wafers by repeatedly cutting through the ingot parallel to one face of the ingot. These slabs are subsequently subdivided into dice of suitable lateral dimensions.

The semiconductor dice employed in semiconductor devices are generally extremely thin, and the exact thickness is important, particularly in production of devices having conductivity type imparting materials alloyed or diffused toward each other from opposite surfaces of the dice. The distance between the two alloyed or diffused regions in a die to a very large extent determines the electrical characteristics of the device. Therefore, in order to obtain uniform characteristics among all the devices which are processed as a single lot, all of the dice employed in the lot must be of the same thickness within very close tolerances.

Semiconductor materials, such as germanium and silicon, which are commonly employed in semiconductor devices are extremely hard and brittle. Because of these physical characteristics it is necessary to cut the slabs or wafers from the ingot much thicker than the final thickness of dice desired. The wafers are generally ground or lapped to reduce their thickness somewhat and to insure flatness and uniformity of thickness throughout the wafer. Each wafer is then divided into dice as by the well known technique of scribing grooves in one surface of the wafer and breaking up the wafer along the grooves. In order further to reduce the dice to the thickness desired in the final devices and to remove the mechanically worked surface layers the dice normally are subjected to a schedule of etching, sorting and re-etching operations designed to obtain from a lot of dice a maximum number of dice approximating the desired thickness.

The schedule of operations includes placing the semiconductor dice in a bath of an etching solution of appropriate strength and for a sufficient time to reduce the thickness of the dice to slightly in excess of that desired in the final product. Although each of the dice obtained from a single slab is originally of substantially the same thickness, the etching procedure when performed according to known techniques does not produce dice of uniform thickness. In recognition of this, the etched dice are each measured and sorted into one of a plurality of groups according to thickness. Each of these groups of thickness greater than that desired is then treated in an etching bath for a period of time calculated to reduce the dice of the group to the desired thickness. However, the variations obtained in dice thicknesses within each group are too great to permit the group of dice to be utilized, without further selection, in the fabrication of semiconductor devices. Rather, each group must be subdivided according to thickness. Dice which are of desired thickness are accepted for device fabrication. Dice which are still too thick are etched again and remeasured for thickness to obtain more useable dice. Dice from any etching stage which are too thin must generally be considered as scrap material to be reprocessed. Since large quantities of dice must each be individually measured at least twice, some type of automatic or semi-automatic sorting apparatus is generally employed. At best the degree of precision obtainable from such apparatus is barely acceptable, and frequently there are significant inaccuracies in sorting. In addition to the inefficiencies of repeated handling involved in the process of reducing semiconductor dice to size as outlined above, the incidence of dice breakage is high and the lack of control of etching frequently results in dice which are of uneven thickness and are characterized by rounded corners giving a "pillow effect" to the dice.

Therefore, it is an object of the present invention to provide an improved method for uniformity removing material from a body of material.

It is a more specific object of the invention to provide a controlled method for uniformly and accurately etching semiconductor dice to desired thickness.

It is also an object of the invention to provide an improved apparatus for etching semiconductor dice.

Briefly, in accordance with the invention, a stream of etching liquid is directed upward into a body of the liquid contained in a vessel to form a zone of liquid movement diverging outward as it extends upward from the region of entrance of the stream into the body of liquid. A quantity of the small bodies to be reduced in size is placed in the zone of the moving liquid. The movement of the liquid maintains the bodies in suspension and in movement within the zone. In this way contact between the individual bodies during the etching operation is minimized or eliminated, and the surfaces of the bodies are constantly exposed to fresh etching liquid. After a predetermined period, the entire quantity of bodies is removed from the etching liquid and rinsed promptly and thoroughly to halt the etching action.

Apparatus for carrying out the operation may include a main vessel for containing a body of etching liquid. The vessel is provided with an inlet and an outlet for the etching liquid. The dice to be etched are confined within the aforementioned zone of moving liquid by a container having a generally conical section. This container has perforations at least as its lowermost extremity and its upper portion through which the etching liquid enters and leaves the zone of movement. Conveniently, this container is removably mounted within the main vessel and, as will be seen from the accompanying drawings and the following more detailed description, the main vessel may have a configuration at the inlet to receive the conical section of the container and to afford positive confinement of the zone of moving liquid.

Additional objects, features, and advantages of the method and apparatus of the invention will become apparent from the following detailed discussion and the accompanying drawings wherein.

Figure 1:
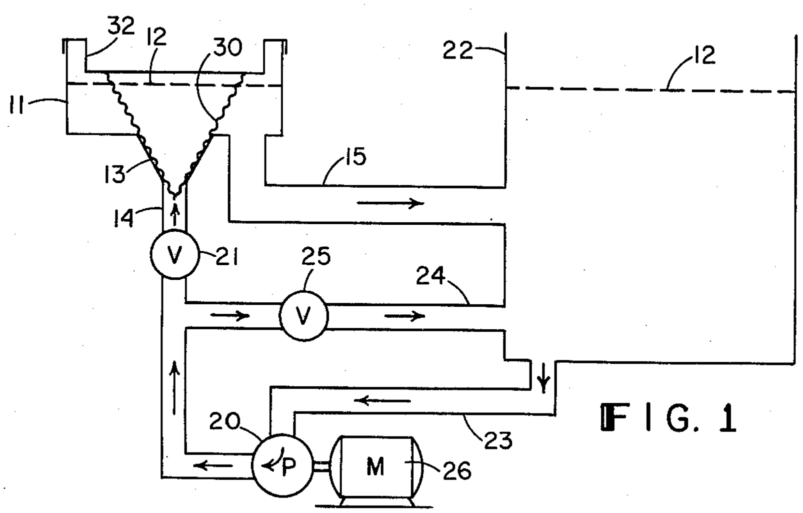
FIG. 1 is a schematic representation of apparatus for etching semiconductor dice to size according to the invention.
Figure 2:
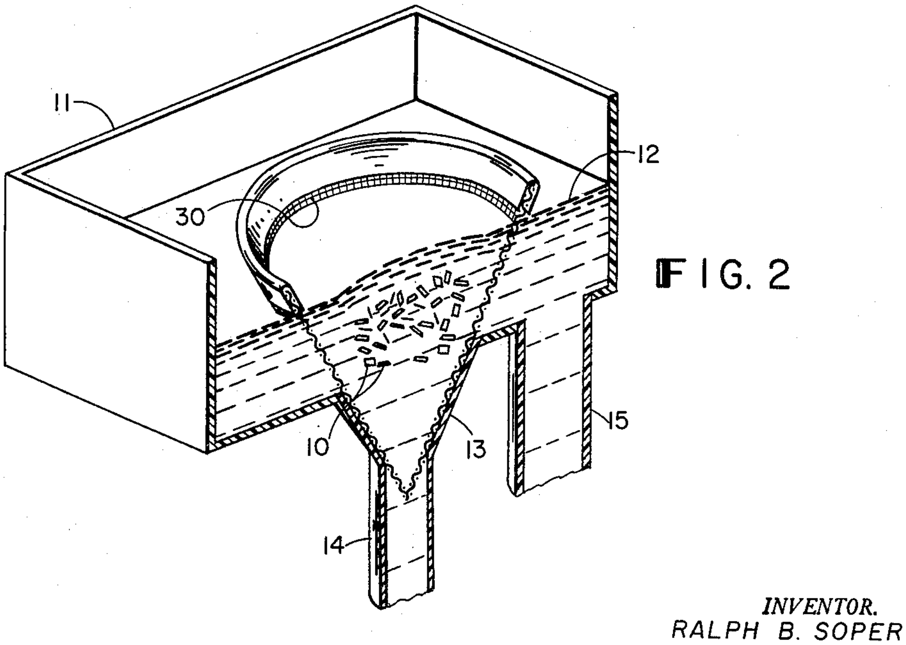
FIG. 2 is a perspective view in section of the portion of the apparatus in which the semiconductor dice are contained during the etching operation.

The apparatus as shown in the drawings includes a treatment tank 11 of a suitable plastic or other material not subject to attack by the chemicals employed in the etching solution 12. The tank includes a funnel-shaped recess 13 set in the floor of the tank which narrows down to an inlet tube 14. An outlet tube 15 leads directly from the floor of the tank. The inlet tube is connected to the discharge of a pump 20 driven by an electric motor 26. A valve 21 is located between the pump and the tank. The outlet tube is connected to a large tank 22 which serves as a reservoir for containing a large volume of etching solution. An outlet 23 from the large tank is connected to the intake connection of the pump. A by-pass tube 24 having a by-pass valve 25 is connected between the output connection of the pump and the large tank. All tubing, valves, connections, internal parts of the pump and other fittings exposed to the etching solution are constructed of suitably etchant resistant materials.

A cone-shaped vessel 30 of a suitable screen material serves as a container for the semiconductor dice undergoing treatment. The vessel is of such a shape as to conform to the funnel-shaped recess 13 in the floor of the tank.

In utilizing the apparatus above described in practicing the method of the invention a quantity of semiconductor dice which occupies a small volume relative to the volume of the cone is placed in the cone. The electric motor is operated and the pump circulates etching solution into the treatment tank via the inlet tube and the funnel-shaped recess. The level of the solution in the treatment tank 11 is maintained constant by the flow of solution into the large reservoir tank 22 through the outlet tube 15. Both tanks are open to the atmosphere and thus the level of the solution is maintained constant in both tanks. The foraminous cone-shaped vessel is positioned in the funnel-shaped recess, vertex downward, with the level of the solution in the tank below the top of the cone. The cone is held snugly in positon in the funnel against the force of the circulating etching solution by a transparent cover 32 placed on the top or base of the cone.

Figure 3:
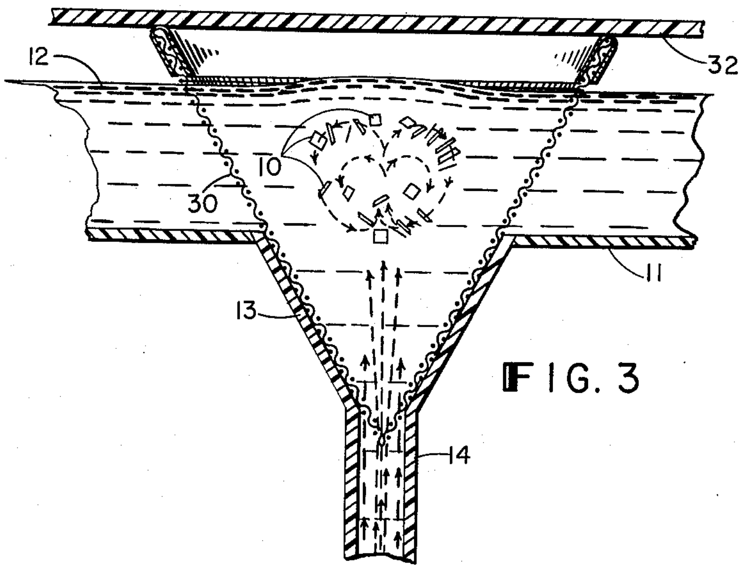
FIG. 3 is a view in cross section of portions of the apparatus of FIG. 1 illustrating diagrammatically the movement of etching material and dice during the treatment of dice according to the invention.

The rate of flow of etching material through the system is regulated by adjustment of the valves 21 and 25 in order to provide the desired action of the etching solution and dice as illustrated diagrammatically in FIG. 3. Etching solution moves upward through the inlet tube and the funnel as indicated by the arrows, and as the solution advances farther from the inlet tube its velocity decreases because of the progressively increasing diameter of the funnel. Since there are many factors which affect the flow of solution through the vessel including friction with the walls of the vessel and the flow of solution out through the sides of the vessel, actual directions of flow cannot be precisely presented. However, as concerns the action on the dice undergoing treatment, the movement of solution approximates that shown by the arrows extending upwardly from the solution inlet in FIG. 3.

The movements of the dice in the cone are determined by the direction and rate of flow of the solution and the configuration and weight of the dice. Each dice is carried upward by the current, and when it reaches a region in the vessel where the current has decreased sufficiently the dice tends to move with the solution toward the edge of the vessel and then fall back toward the region of the vertex. The various factors combine tending to move the dice separately in paths similar to that indicated by the curved arrows associated with the dice. The rate of flow of etching material is adjusted by means of the valves to maintain the quantity of dice well up away from the vertex of the cone and as widely dispersed as possible in order to minimize contact of the dice with each other and with spent etching material. The rate of flow should not be so high as to cause the dice to break through the surface of the solution because surface tension effects can cause the surfaces of dice to remain out of the influence of fresh etching solution for sufficient time to disrupt the constant, uniform etching desired.

The etching solution which is directed upward toward the dice undergoing treatment is taken into the pump 20 from the large volume of solution in the reservoir 22. The large volume insures that the etching liquid which contacts the dice is fresh and uncontaminated. In addition, heat given off by the etching action is dissipated throughout a large volume of liquid thus maintaining the temperature of the solution essentially constant and not affecting the rate of etching.

Figure 4A:
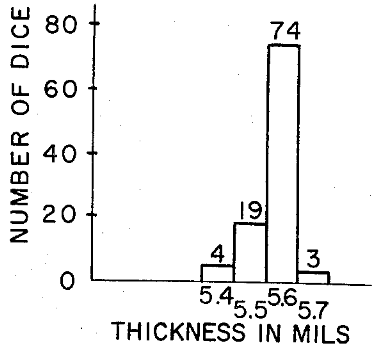
FIG. 4A is a diagram showing the distribution by thickness of a sample of dice from a lot of dice prior to treatment of the lot according to the invention.

In a typical application of the method of the invention an ingot of single crystal germanium of N-type conductivity was formed according to generally employed well-known techniques. The ingot was then sliced into wafers or slabs about 8.5 to 10 mils thick having the 1, 1, 1 plane exposed at the major surfaces. The wafers were then lapped to a thickness of less than 6 mils. Perpendicularly intersecting sets of parallel grooves about .080 inch apart were scribed in one major surface of each wafer with a diamond tipped scribing tool. The wafers were then broken up along these grooves to form the individual dice. A lot of 2,500 dice weighing about 4 grams was taken from the dice produced from a lot of wafers lapped to within less than 0.2 mil of each other. A random sample of 100 dice from the lot were precisely measured for thickness on a dial indicating micrometer. FIG. 4A is a diagram showing the distribution of the dice in this sample by thickness. The lot of dice were then placed in a screen vessel in the form of a 60° right circular cone having a base diameter of 6 inches. The screen was of 30 mesh fabricated from .012 inch stainless steel wire. The lot of dice filled the vertex end of the conical vessel to a depth of about 3/8 inch.

The treatment tank 11 was 9 inches square by 4 inches high, and was filled to a depth of about 2 inches with etching solution. The reservoir tank 22 contained approximately 100 liters of etching solution. The funnel 13 had a diameter of 3 inches at the floor of the tank and conformed to the 60° angle of the cone. The inlet tube 14 had an internal diameter of 3/4 inch. Both of the tanks, and all tubing, valves, and fittings were of rigid polyvinyl chloride plastic material. Internal parts of the pump were fabricated of polyethylene.

The etching solution employed consisted of the following materials in parts by volume:

1 part hydrofluoric acid (48% HF)
1 part hydrogen peroxide (30% $H_2O_2$)
3 parts of demineralized water This material is a preferential etching solution which attacks the 1, 1, 1 surfaces of a germanium body at a rate slightly greater than the rate of attack at the other surfaces. At a temperature of 25° C. this solution etches a surface in the 1, 1, 1 plane at a rate of 0.25 mil per minute.

Figure 4B:
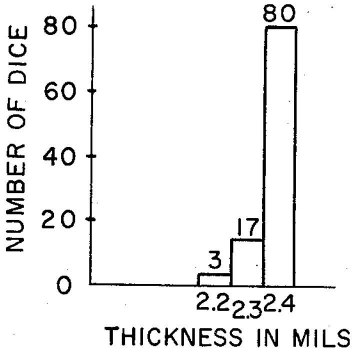
FIG. 4B is a diagram showing the distribution by thickness of a sample taken from the same lot of dice subsequent to treatment according to the invention.

The vessel containing the dice was placed in position in the funnel-shaped recess. Etching solution was pumped into the treatment tank at a rate of about 3 gallons per minute; fine adjustment of the rate of flow being made to obtain the desired movement of the dice within the cone as explained hereinabove. The etching treatment was carried on for about 7 minutes with the solution at room temperature. The container with the dice was then removed from the tank and was thoroughly rinsed with demineralized water to remove all traces of the etching solution from the dice and the container. After the lot of dice had been dried, a random sample of 100 dice were taken from the lot and precisely measured. FIG. 4B is a diagram showing the distribution of the dice in the sample by thickness.

As can be seen from a comparison of the diagrams of FIGS. 4A and 4B, the dice in the lot originally possessed a spread of thicknesses of about 0.3 mil and about 90% of the dice were within a 0.2 mil range. After treatment the thickness of the dice in the lot exhibited a spread of about the same, and approximately the same percentage of the lot were within a 0.2 mil range. These results demonstrate the uniformity of etching attained by employing the method and apparatus of the invention.

In contrast to the close control obtained in reducing dice to size according to the invention, previously employed techniques provided almost no control. For example, a lot of 2,000 dice obtained from wafers of germanium which had been lapped to a thickness of 6 mils ±0.15 mil was placed in a screen basket and immersed in an etching solution for 20 seconds according to well known procedures. The etching solution, which is a standard solution employed throughout the semiconductor industry for reducing dice to size, was of the following composition:

| | Milliliters |
|---|---|
| Hydrofluoric acid (48% HF) | 273 |
| Nitric acid (69.5% $HNO_3$) | 455 |
| Acetic acid (99.6% $HC_2H_3O_2$) | 273 |
| Bromine | 2 |

Figure 5:
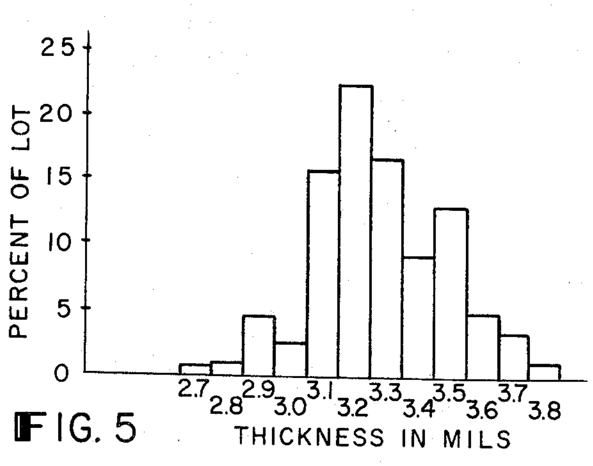
FIG. 5 is a diagram showing the distribution by thickness of a lot of dice subjected to treatment according to known methods for reducing semiconductor dice to size.

After the etching treatment the lot of dice was sorted into groups on an automatic measuring and sorting apparatus. A sample of dice from each group was then measured precisely. On the basis of these samples the distribution of dice in the entire lot by thickness was computed. This distribution expressed in percentages of the entire lot is shown in the diagram of FIG. 5. Data for approximately 96% of the lot is plotted in the diagram. The majority of the remainder of the dice were scattered in thickness throughout the range from 1.3 to 2.6 mils. In contrast to the 0.2 mil range of thicknesses obtained for more than 90% of the dice processed according to the invention as shown in FIG. 4B, dice over the much wider range of from 2.9 to 3.6 mils were required to encompass 90% of this lot processed according to the prior art technique. It is because the spread of thicknesses is so great that each entire lot processed in the prior art manner has been sorted into groups by size, each group separately treated in a slower acting aqeuous etching solution, and then each group re-sorted according to dice thickness to select out dice of the desired thickness for further processing.

In accordance with the objects of the invention a method and apparatus for accurately and uniformly reducing semiconductor dice to desired thickness have been provided. The spread of thicknesses exhibited by the dice in a lot is approximately the same after treatment as before. Because of the close control obtained many advantages are realized over previously employed techniques. The etching treatment may be performed in one operation, and only a sample of each lot need be measured before and after processing to determine the thickness of dice in the lot. The inaccuracies in sorting large quantities of dice are eliminated since no sorting is necessary. In addition, with reduced handling incidental breakage of dice is reduced to a minimum.

What is claimed is:

1. The method of dissolving portions of bodies of semiconductor material to reduce the bodies to predetermined dimensions including the steps of placing a plurality of bodies of semiconductor material in a foraminous container, immersing said container in a bath of etching solution, forcing etching solution upward through the lowermost portions of said container, the velocity of movement of said etching solution becoming less in portions of said container removed from said lowermost portions whereby bodies carried upward away from said lowermost portion tend to fall back toward said lowermost portion for further upward movement, removing said container and said bodies from said solution when the bodies have been reduced to said predetermined dimensions, and rinsing the etching solution therefrom.

2. The method of etching bodies of a material soluble in an etching liquid to predetermined dimensions which comprises directing a stream of etching liquid upward into a body of the liquid to form therein a zone of liquid movement divergent outward as it extends upward from the region of entrance of the stream into the body, introducing a quantity of said bodies into said zone whereby said bodies are carried upwardly and moved about within said zone, confining said bodies in said zone for sufficient time to reduce said bodies to said predetermined dimensions, and promptly thereafter removing said bodies from said zone and rinsing to halt the etching action.

3. The method of dissolving portions of bodies of semiconductor material to reduce the bodies to predetermined dimensions including the steps of placing a plurality of bodies of semiconductor material in a cone-shaped foraminous container, immersing said container in an etching solution with the vertex of the container downward, directing a stream of etching solution upward through the region of the vertex and forming a zone of movement of the etching solution within said container whereby said bodies tend to move upward out of the region of the vertex and circulate through the etching solution within the container, removing said container and said bodies from said etching solution when the bodies have been reduced to said predetermined dimensions, and rinsing said bodies in water.

4. Apparatus for subjecting a plurality of bodies of semiconductor material to treatment in an etching solution, said apparatus including a treatment tank for containing etching solution, said treatment tank having a funnel-shaped recess in the bottom thereof, an input connection at the lowermost portion of said recess for directing a stream of etching solution upward into said tank through said funnel-shaped recess, a foraminous cone-shaped container for said bodies adapted to be removably positioned in said recess and to permit free movement of said stream therethrough, a reservoir tank for containing a large volume of etching solution, an outlet connection between said treatment tank and said reservoir tank for permitting the flow of etching solution from said treatment tank to said reservoir tank thus maintaining the levels of solution in said tanks equal, and connections from said reservoir tank to the input connection at the recess in the bottom of the treatment tank including pumping means for forcing etching solution from said reservoir tank upward into said treatment tank.

5. Apparatus for subjecting a plurality of bodies of semiconductor material to treatment in an etching solution, said apparatus including a tank for containing a quantity of etching solution, said tank having a funnel-shaped depression in the floor thereof, an inlet tube connected at the bottom of said depression, a cone-shaped foraminous vessel adapted to fit snugly in said depression and extend above the level of the floor of the tank for containing bodies of semiconductor material undergoing treatment, and etching solution circulating means for forcing a stream of solution upward into the tank through the inlet tube and funnel-shaped depression and for withdrawing solution from the tank to maintain the solution at a constant level in the tank.

6. Apparatus for subjecting a plurality of bodies of semiconductor material to treatment in an etching solution, said apparatus including a treatment tank for containing a bath of etching solution; means for maintaining the depth of the bath of etching solution at a predetermined level in said tank; a solution inlet in the lower portion of said tank, said inlet having a conical, upwardly divergent, terminal section entirely below said predetermined level; and a cone-shaped foraminous container for said bodies, said container being supported within said terminal section with its vertex downward and its divergent end extending above said terminal section, whereby the upward velocity of etching solution entering said tank through said inlet and passing through said container is caused to decrease progressively as the solution moves upward, and bodies carried upward by the solution from the lower part of the container tend to fall back toward the lower part for further upward movement.

References Cited in the file of this patent

UNITED STATES PATENTS

| | | |
|---|---|---|
| 1,635,115 | Deutsch et al. | July 5, 1927 |
| 1,681,322 | Cave | Aug. 21, 1928 |
| 2,044,524 | Caise | June 16, 1936 |
| 2,288,128 | Erz | June 30, 1942 |
| 2,536,912 | Corbett | Jan. 2, 1951 |
| 2,592,729 | Pennell | Apr. 15, 1952 |
| 2,720,771 | Lewis | Oct. 18, 1955 |
| 2,762,150 | Edds | Sept. 11, 1956 |
| 2,788,008 | Wanzer | Apr. 9, 1957 |
| 2,822,635 | Mears | Feb. 11, 1958 |
| 2,860,646 | Zucker | Nov. 18, 1958 |
| 2,952,528 | Cornelison | Sept. 13, 1960 |